US011444611B2

(12) United States Patent
Ma

(10) Patent No.: US 11,444,611 B2
(45) Date of Patent: Sep. 13, 2022

(54) CHIP HAVING A RECEIVER INCLUDING A HYSTERESIS CIRCUIT

(71) Applicant: MEDIATEK INC., Hsinchu (TW)

(72) Inventor: Wei-Yu Ma, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 17/474,326

(22) Filed: Sep. 14, 2021

(65) Prior Publication Data

US 2022/0109437 A1 Apr. 7, 2022

Related U.S. Application Data

(60) Provisional application No. 63/087,929, filed on Oct. 6, 2020.

(51) Int. Cl.
  *H03K 5/1252* (2006.01)
  *H03K 3/037* (2006.01)
  *H03K 17/687* (2006.01)

(52) U.S. Cl.
  CPC .......... *H03K 5/1252* (2013.01); *H03K 3/037* (2013.01); *H03K 17/6872* (2013.01); *H03K 17/6874* (2013.01)

(58) Field of Classification Search
  CPC .. H03K 5/1252; H03K 3/037; H03K 17/6872; H03K 17/6874
  See application file for complete search history.

(56) References Cited

U.S. PATENT DOCUMENTS 8,225,125 B2 7/2012 Yu et al.
8,289,755 B1 10/2012 Rahim et al.
11,190,187 B2* 11/2021 Chen ................ H03K 19/00384
2006/0226889 A1 10/2006 Gupta et al.
2009/0174433 A1 7/2009 Pasqualini
2010/0033214 A1 2/2010 Deshpande et al.
2016/0105183 A1 4/2016 Kim
2019/0173471 A1 6/2019 Chen et al.

FOREIGN PATENT DOCUMENTS

TW I325691 B 6/2010

OTHER PUBLICATIONS

Search Report dated Mar. 1, 2022 of its corresponding European patent application No. 21198692.2.
Office Action dated Apr. 22, 2022 of its corresponding Taiwan patent application.

* cited by examiner

*Primary Examiner* — Metasebia T Retebo
(74) *Attorney, Agent, or Firm* — McClure, Qualey & Rodack, LLP

(57) ABSTRACT

A hysteresis circuit to be produced within a receiver of a chip is shown. The hysteresis circuit is powered by an overdrive voltage (2VDD), and has a protection circuit, an inverter, and a latch. The input of the hysteresis circuit is coupled to the inverter through the protection circuit, to be transformed into an output, and the latch is coupled to the inverter for positive feedback control. The protection circuit has a first sub-circuit (coupling the input to the inverter to control the pull-up path of the inverter) biased by a first bias voltage that is lower than VDD, and a second sub-circuit (coupling the input to the inverter to control the pull-down path of the inverter) biased by a second bias voltage that is greater than VDD.

16 Claims, 8 Drawing Sheets

CHIP HAVING A RECEIVER INCLUDING A HYSTERESIS CIRCUIT

CROSS REFERENCE TO RELATED APPLICATIONS

This application claims the benefit of U.S. Provisional Application No. 63/087,929, filed Oct. 6, 2020, the entirety of which is incorporated by reference herein.

BACKGROUND OF THE INVENTION

Field of the Invention

The present invention relates to hysteresis circuits (e.g., Schmitt trigger circuits).

Description of the Related Art

A higher bandwidth requirement between an application processor (AP) and the surrounding peripheral devices on a printed circuit board (PCB) is a trend for 5G mobile phones. In order to meet this target, we have to increase the data clock frequency and use a 1-to-N control for communication between the AP and the numerous peripheral devices.

However, signal glitches may happen in the communication. FIG. 1 shows a waveform of a signal transmitted between the AP and the peripheral devices. The glitches are due to signal reflection. Signal reflection occurs when a signal is transmitted along a trace. Some of the signal power may be reflected back to its origin rather than being carried all the way along the trace to the far end. The binary digits obtained from such a signal may be wrong.

How to enhance signal integrity to deal with the signal reflection problem is an important topic in the field of the present invention.

BRIEF SUMMARY OF THE INVENTION

To enhance the signal integrity, a chip whose receiver includes a hysteresis circuit is shown.

A hysteresis circuit in accordance with an exemplary embodiment of the present invention comprises a protection circuit, an inverter, and a latch. The hysteresis circuit is powered by an overdrive voltage (2VDD) which is twice the power supply voltage (VDD). The input of the hysteresis circuit is coupled to the inverter through the protection circuit, to be transformed into an output, and the latch is coupled to the inverter for positive feedback control. The protection circuit has a first sub-circuit biased by a first bias voltage that is lower than VDD, and a second sub-circuit biased by a second bias voltage that is greater than VDD. Through the first sub-circuit of the protection circuit, the input is coupled to the inverter to control the pull-up path of the inverter. Through the second sub-circuit of the protection circuit, the input is coupled to the inverter to control the pull-down path of the inverter.

In an exemplary embodiment, the pull-up path of the inverter is biased by a third bias voltage that is less than VDD, and the pull-down path of the inverter is biased by a fourth bias voltage that is greater than the power supply voltage. The third bias voltage may be greater than or equal to the first bias voltage. The fourth bias voltage is less than or equal to the second bias voltage.

In an exemplary embodiment, the latch has a first sub-circuit biased by a fifth bias voltage that is less than VDD, and a second sub-circuit biased by a sixth bias voltage that is greater than VDD. The first sub-circuit of the latch is coupled to the pull-up path of the inverter. The second sub-circuit of the latch is coupled to the pull-down path of the inverter. The fifth bias voltage may be greater than or equal to the first bias voltage. The sixth bias voltage is less than or equal to the second bias voltage.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

To enhance the signal integrity, a hysteresis circuit (such as a Schmitt trigger circuit) for signal inversion is used in a receiver of a chip. The hysteresis is implemented by positive feedback control.

Figure 1:
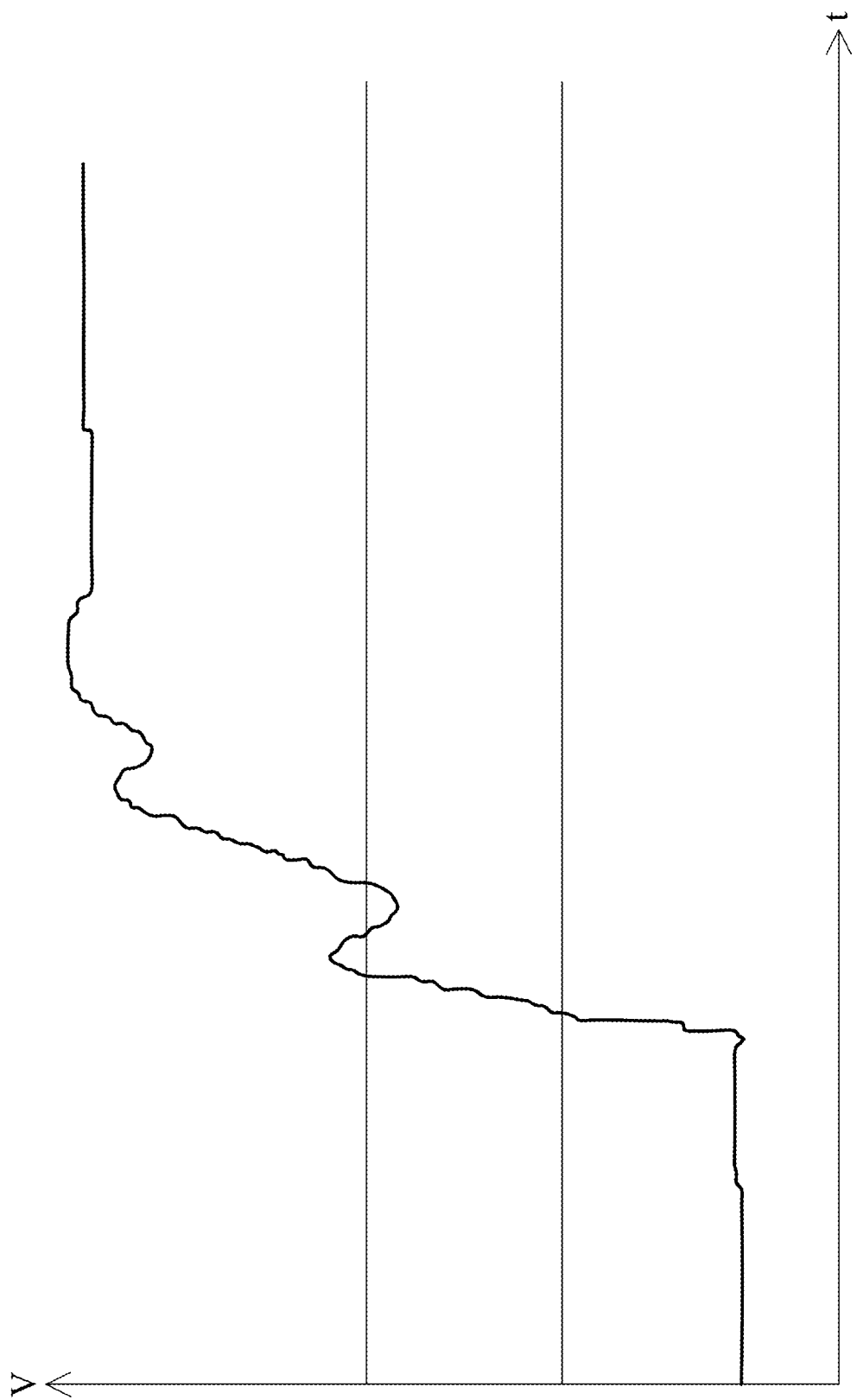
FIG. 1 shows a waveform of a signal transmitted between the AP and the peripheral devices.
Figure 2A:
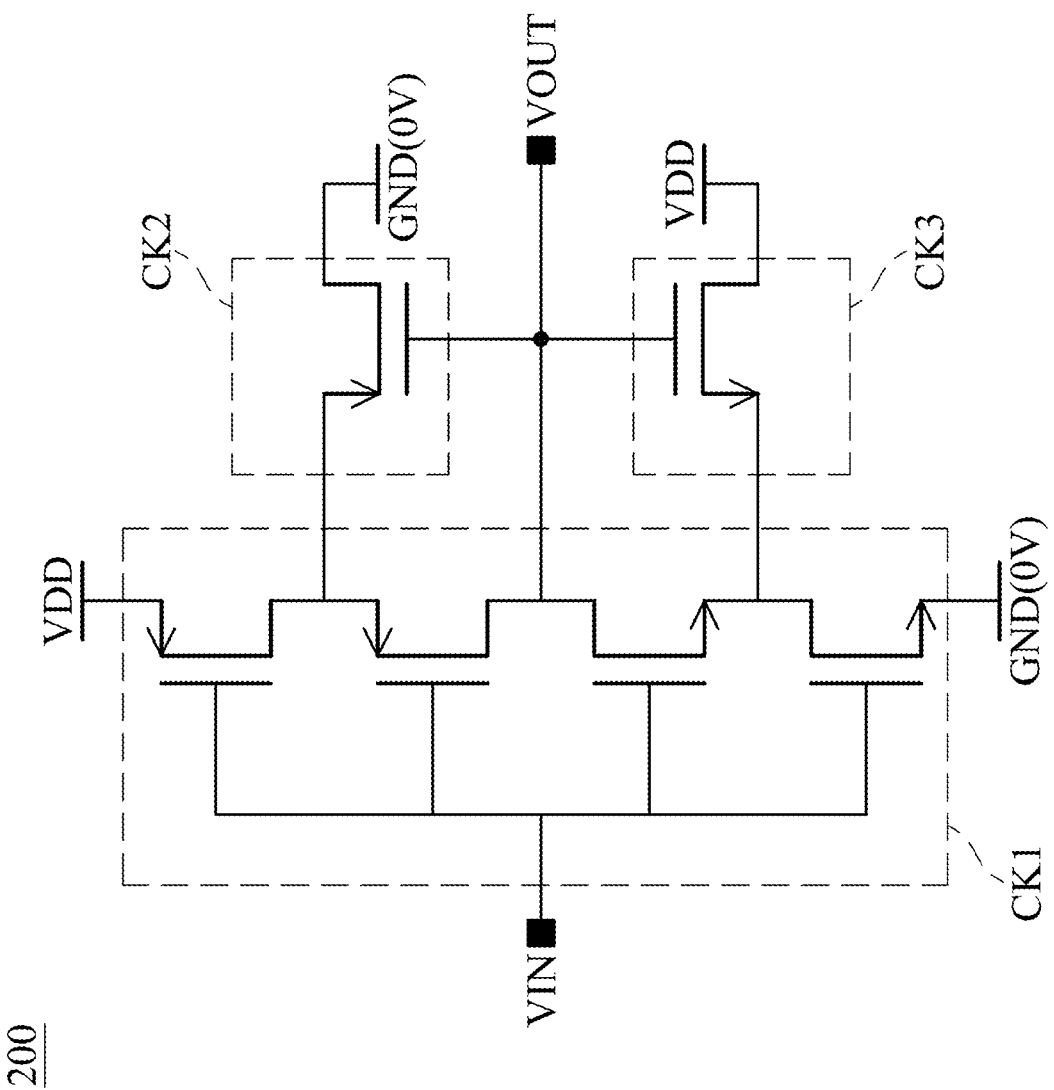
FIG. 2A depicts a Schmitt trigger circuit 200.

FIG. 2A depicts a Schmitt trigger circuit 200, which includes an inverter CK1 and a latch (including sub-circuits CK2 and CK3). The Schmitt trigger circuit 200 is powered by a power supply voltage VDD. An analog signal received by a receiver of a chip is coupled to the Schmitt trigger circuit 200 as an input VIN and then transformed into a digital signal as an output VOUT. The sub-circuit CK2 of the latch is coupled to the pull-up path of the inverter CK1, and the sub-circuit CK3 of the latch is coupled to the pull-down path of the inverter CK1. The latch (including sub-circuits CK2 and CK3) applies a positive feedback to the inverter CK1. The output VOUT retains its value until the input VIN changes sufficiently to trigger a change.

Figure 2B:
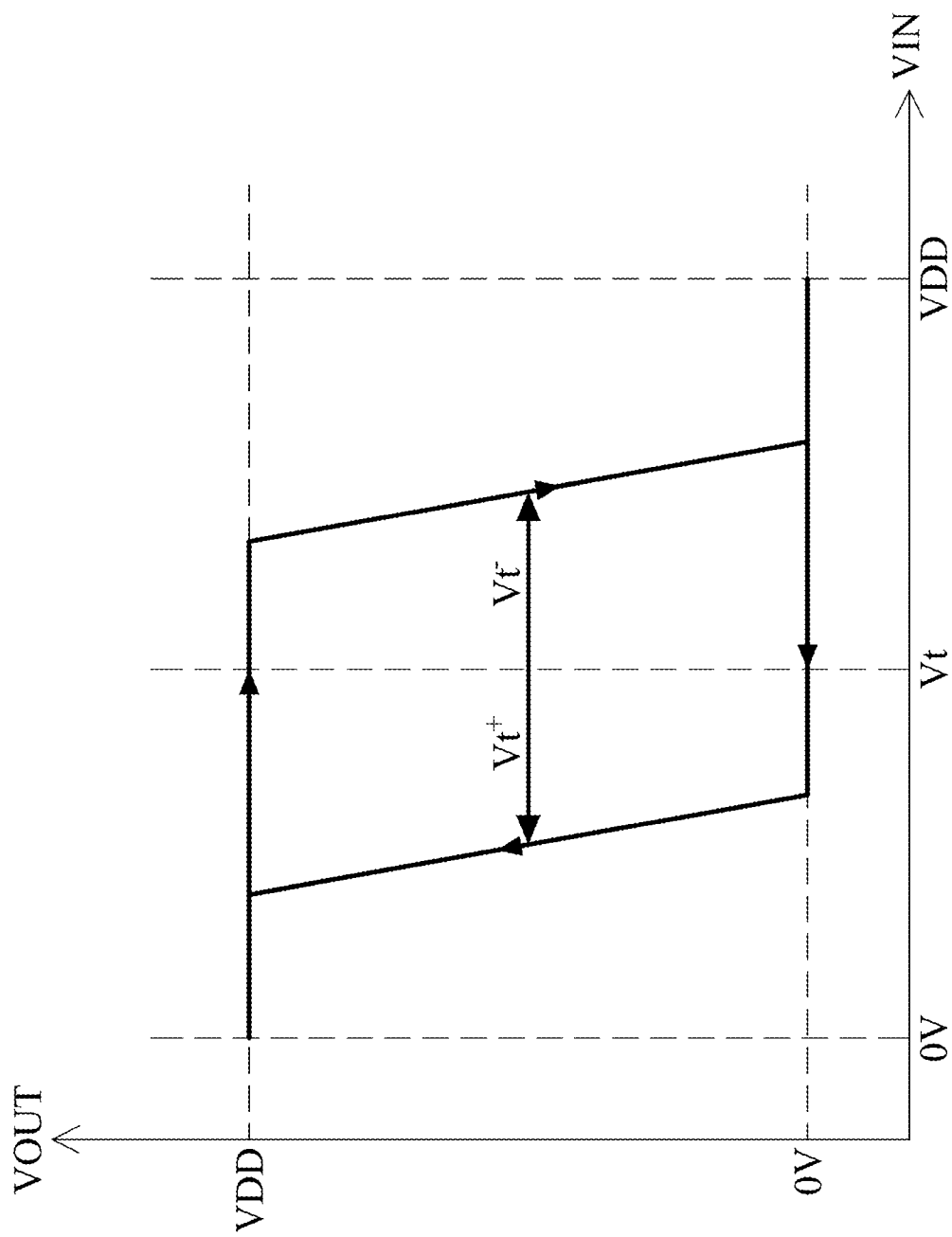
FIG. 2B illustrates a transfer function of the Schmitt trigger circuit 200.

FIG. 2B illustrates a transfer function of the Schmitt trigger circuit 200. With the positive feedback control, the output VOUT retains low when the input VIN has not dropped to the lower threshold level (Vt−Vt$^+$), and the output VOUT retains high when the input VIN has not exceeded the higher threshold level (Vt+Vt$^-$). This dual threshold action is called hysteresis. The hysteresis window defines the threshold levels for switching as the input VIN rises or falls.

Figure 3:
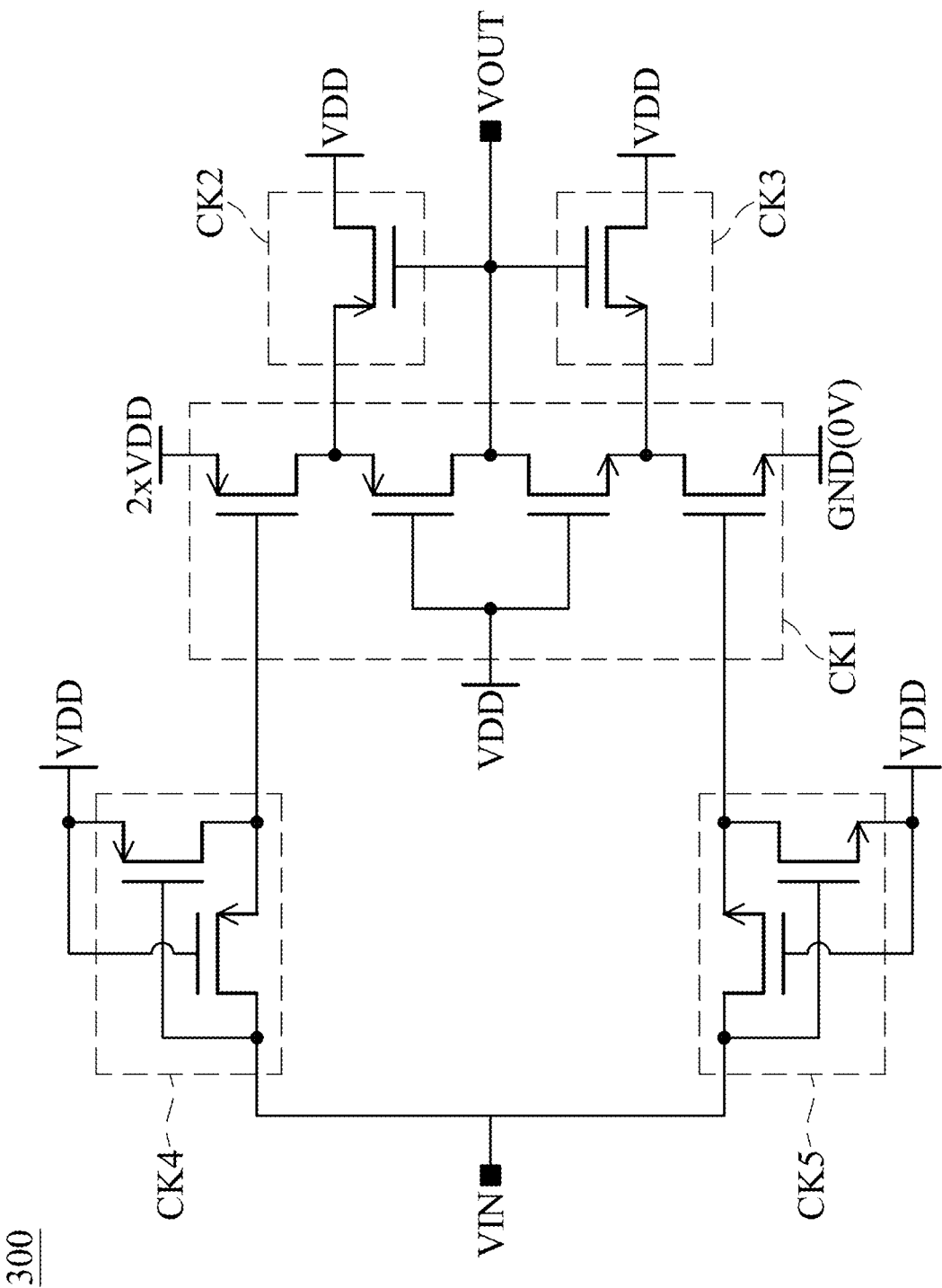
FIG. 3 depicts a Schmitt trigger circuit 300 with the overdrive design.

As the process technology evolves (e.g., scaling down to 5 nm, 4 nm, 3 nm, or below), the maximum applied voltage is suppressed (e.g., down to 1.2V, much lower than the 1.8V applied to the 7 nm products). If there are 7 nm chips as well as the more advanced (5 nm/4 nm/3 nm or below) chips on the same printed circuit board (PCB), an overdrive design is required. An overdrive voltage 2VDD (e.g., 1.8V) has to be generated to operate the 7 nm chips, and protection circuits for the advanced chips (5 nm/4 nm/3 nm or below) are necessary. FIG. 3 depicts a Schmitt trigger circuit 300 with the overdrive design.

In FIG. 3, the Schmitt trigger circuit 300 is powered by the overdrive voltage 2VDD (twice the power supply voltage VDD), and a protection circuit (including sub-circuits CK4 and CK5) is required prior to the inverter CK1 to operate the all components in a safe operating area (SOA). Through the sub-circuit CK4 of the protection circuit, the input VIN is coupled to the inverter CK1 to control the pull-up path of the inverter CK1. Through the sub-circuit CK5 of the protection circuit, the input VIN is coupled to the inverter CK1 to control the pull-down path of the inverter CK1. The power supply voltage VDD is used to bias the protection circuit (including the sub-circuits CK4 and CK5), the inverter CK1, and the latch (including the sub-circuits CK2 and CK3). However, the Schmitt trigger circuit 300 with the overdrive design may narrow the hysteresis window.

In an exemplary embodiment, the overdrive voltage 2VDD is 1.8V and the threshold voltage Vt to activate a transistor manufactured by the advanced process is 0.55V. In such a situation, the headroom is only 0.35V, which is a difference between the power supply voltage VDD (0.9V) and the threshold voltage 0.55V. The limited headroom 0.35V considerably narrows the hysteresis window, and the signal integrity is significantly affected.

Figure 4:
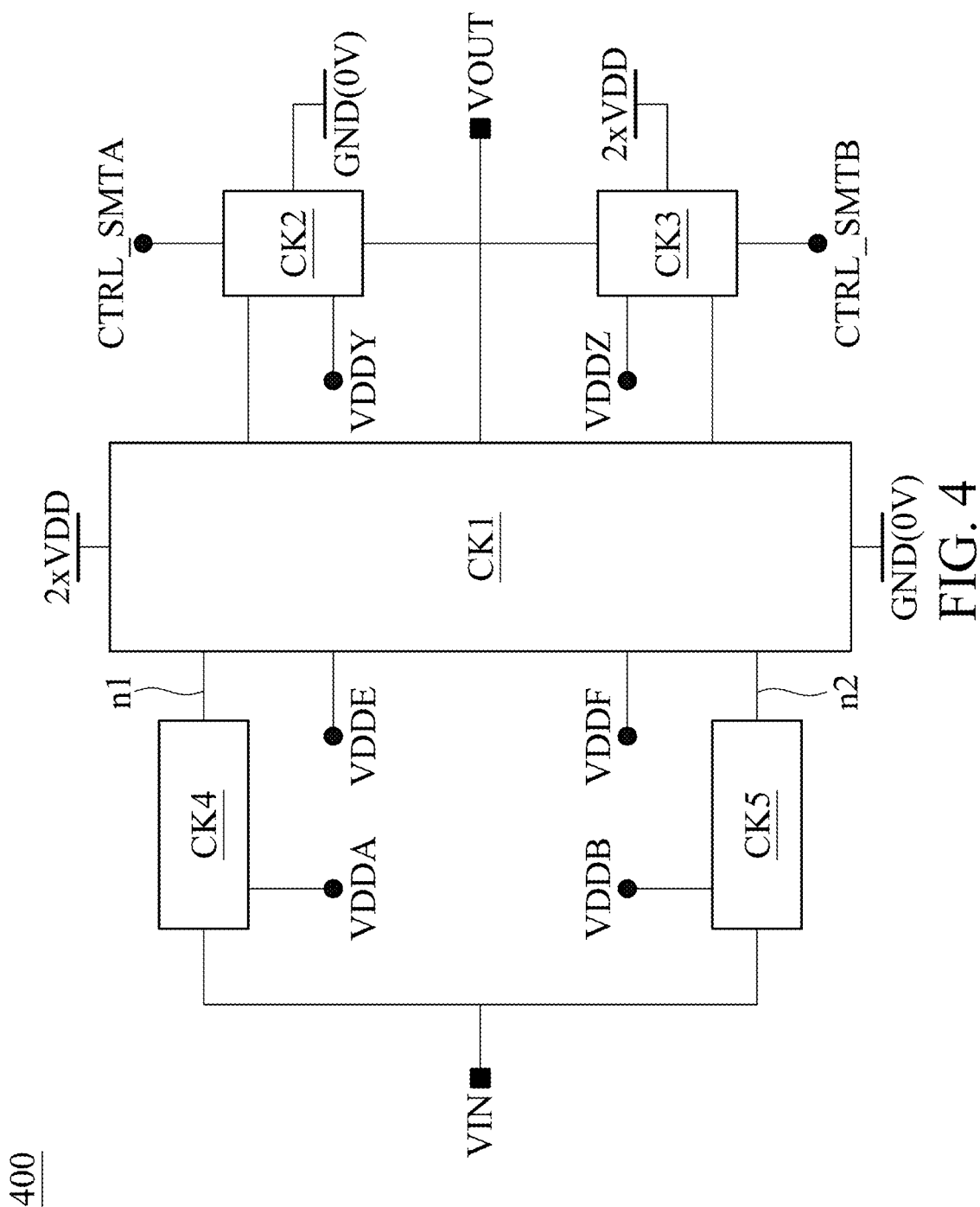
FIG. 4 illustrates a hysteresis circuit 400 in accordance with an exemplary embodiment of the present invention.

To extend the width of the hysteresis window, a novel hysteresis circuit is introduced. FIG. 4 illustrates a hysteresis circuit 400 in accordance with an exemplary embodiment of the present invention. The hysteresis circuit 400 is powered by an overdrive voltage 2VDD (twice the power supply voltage VDD), and additional bias voltages (e.g., VDDA, VDDB, VDDE, VDDF, VDDY and VDDZ) are required to bias the hysteresis circuit 400. The input VIN and the output VOUT are between 0V~2VDD. The bias voltages VDDA, VDDB, VDDE, VDDF, VDDY and VDDZ are between 0V~2VDD, too. The bias voltages VDDA, VDDE and VDDY are less than VDD, and the bias voltages VDDB, VDDF and VDDZ are greater than VDD.

In comparison with FIG. 3, an output node n1 of the sub-circuit CK4 of the protection circuit of the hysteresis circuit 400 can reach the lower voltage level (because VDDA<VDD), and an output node n2 of the sub-circuit circuit CK5 of the protection circuit of the hysteresis circuit 400 can reach the greater voltage level (because VDDB>VDD). The headroom for operating the transistors of the inverter CK1 is increased. The hysteresis window of the hysteresis circuit 400 can be at least four times that of the Schmitt trigger circuit 300.

The design that employs the bias voltages VDDE, VDDF, VDDY and VDDZ has options. The bias voltages VDDE (lower than VDD) and VDDF (greater than VDD) may be fed into the pull-up path and the pull-down path of the inverter CK1, respectively. The bias voltages VDDY (lower than VDD) and VDDZ (greater than VDD) may be fed into the sub-circuit CK2 and the sub-circuit CK3 of the latch, respectively. The hysteresis circuit 400 with all of the bias voltages VDDA, VDDB, VDDE, VDDF, VDDY and VDDZ may result in a more significant hysteresis in comparison with a Schmitt trigger circuit that only uses the bias voltages VDDA and VDDB. The bias voltage VDDA may be less than or equal to the bias voltage VDDY, and it may also be less than or equal to the bias voltage VDDE. The bias voltage VDDB may be greater than or equal to the bias voltage VDDZ, and it may also be greater than or equal to the bias voltage VDDF.

There are control signals CTRL_SMTA and CTRL_SMTB for controlling the positive feedback. As the control signal CTRL_SMTA enables the sub-circuit CK2 of the latch, a positive feedback is applied to expand the hysteresis range $Vt^-$. As the control signal CTRL_SMTB enables the sub-circuit CK3 of the latch, a positive feedback is applied to expand the hysteresis range $Vt^+$. The design that employs the control signals CTRL_SMTA and CTRL_SMTB has options.

Figure 5:
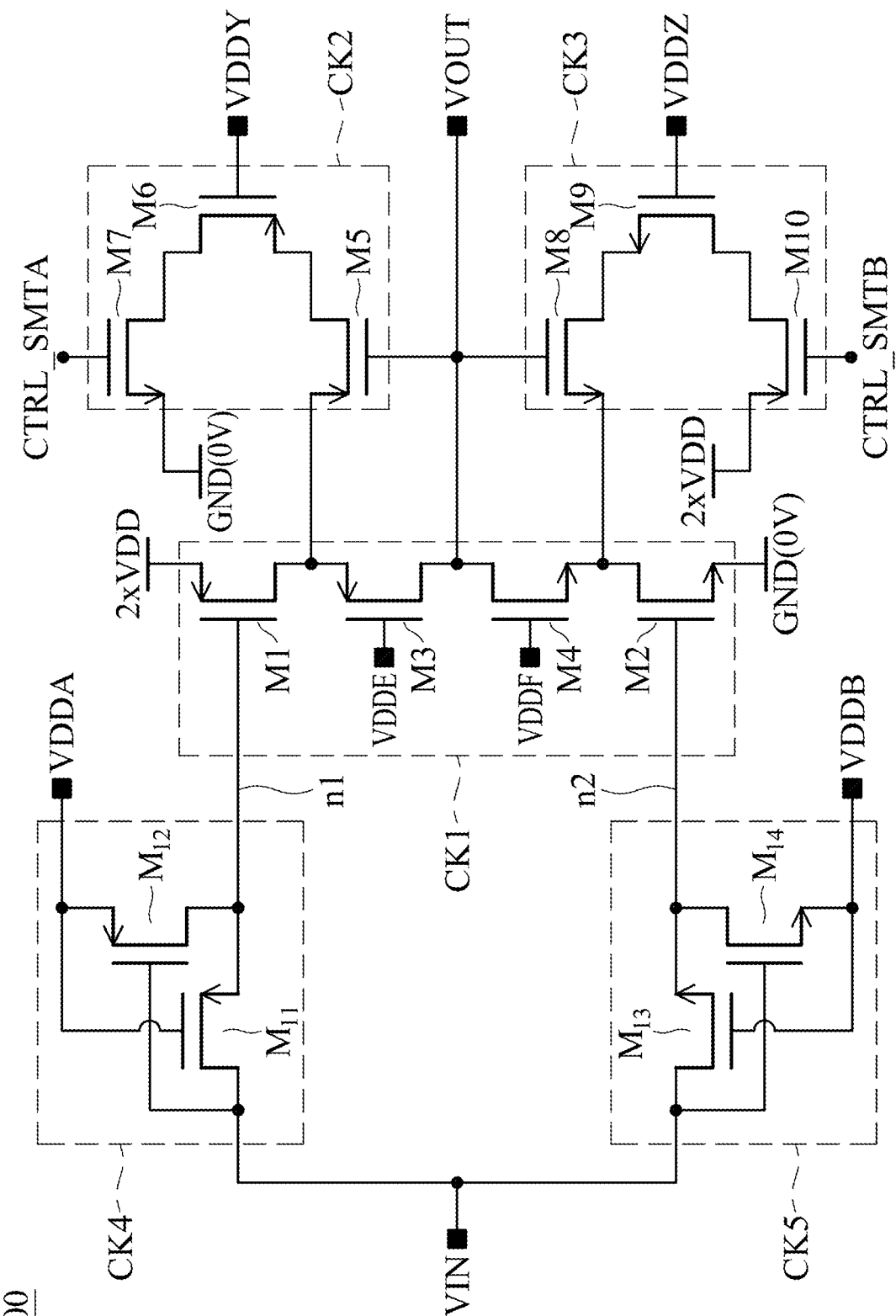
FIG. 5 depicts a hysteresis circuit 500 in details in accordance with an exemplary embodiment of the present invention.

FIG. 5 depicts a hysteresis circuit 500 in details in accordance with an exemplary embodiment of the present invention. The inverter CK1 has a p-channel metal-oxide-silicon (PMOS) transistor M1 and an n-channel metal-oxide-silicon (NMOS) transistor M2. The gate terminal of the PMOS transistor M1 is coupled to the output node n1 of the sub-circuit CK4. Because the voltage level of the output node n1 of the sub-circuit CK4 is reduced by the bias voltage VDDA (VDDA<VDD), the turned-on PMOS transistor M1 has a stronger capability to pull up the voltage level of the output VOUT. The gate terminal of the NMOS transistor M2 is coupled to the output node n2 of the sub-circuit CK5. Because the voltage level of the output node n2 of the sub-circuit CK5 is increased by the bias voltage VDDB (VDDB>VDD), the turned-on NMOS transistor M2 has a stronger capability to pull down the voltage level of the output VOUT.

The inverter CK1 further has a PMOS transistor M3 and an NMOS transistor M4. The PMOS transistor M1 is coupled to the output VOUT via the PMOS transistor M3. The NMOS transistor M2 is coupled to the output VOUT via the NMOS transistor M4. The bias voltage VDDE (<VDD, and ≥VDDA) is coupled to the gate terminal of the transistor M3, and the bias voltage VDDF (>VDD, and ≤VDDB) is coupled to the gate terminal of the transistor M4. By adjusting the bias voltages VDDE and VDDF to their proper levels, the threshold voltage Vt (referring to FIG. 2B) can be shifted to its ideal value.

The components of the latch (including sub-circuits CK2 and CK3) are described in this paragraph. The sub-circuit CK2 includes PMOS transistors M5 and M6, and an NMOS transistor M7. The PMOS transistor M5 has a source terminal coupled to the drain terminal of the PMOS transistor M1, and a gate terminal coupled to the output VOUT. The PMOS transistor M6 has a source terminal coupled to the drain terminal of the PMOS transistor M5, and a gate terminal biased by the bias voltage VDDY (<VDD, and ≥VDDA). The NMOS transistor M7 has a drain terminal coupled to the drain terminal of the PMOS transistor M6, a gate terminal controlled by the control signal CTRL_SMTA, and a source terminal coupled to a power ground voltage GND. The sub-circuit CK3 includes NMOS transistors M8 and, M9, and a PMOS transistor M10. The NMOS transistor M8 has a source terminal coupled to the drain terminal of the NMOS transistor M2, and a gate terminal coupled to the output VOUT. The NMOS transistor M9 has a source terminal coupled to the drain terminal of the NMOS transistor M8, and a gate terminal biased by the bias voltage VDDZ (>VDD, and ≤VDDB). The PMOS transistor M10 has a drain terminal coupled to the drain terminal of the NMOS transistor M9, a gate terminal controlled by the control signal CTRL_SMTB, and a source terminal coupled to the overdrive voltage 2VDD.

The components of the protection circuit (including sub-circuits CK4 and CK5) are described in this paragraph. The sub-circuit CK4 includes PMOS transistors M11 and M12. The input VIN is coupled to the node n1 through the PMOS transistor M11. The gate terminal of the PMOS transistor M11 is biased by the bias voltage VDDA (<VDD). The PMOS transistor M12 has a source terminal biased by the bias voltage VDDA, a gate terminal coupled to the input VIN, and a drain terminal coupled to the node n1. The sub-circuit CK5 includes NMOS transistors M13 and M14. The input VIN is coupled to the node n2 through the NMOS transistor M13. The gate terminal of the NMOS transistor M13 is biased by the bias voltage VDDB (>VDD). The NMOS transistor M14 has a source terminal biased by the bias voltage VDDB, a gate terminal coupled to the input VIN, and a drain terminal coupled to the node n2.

Figure 6:
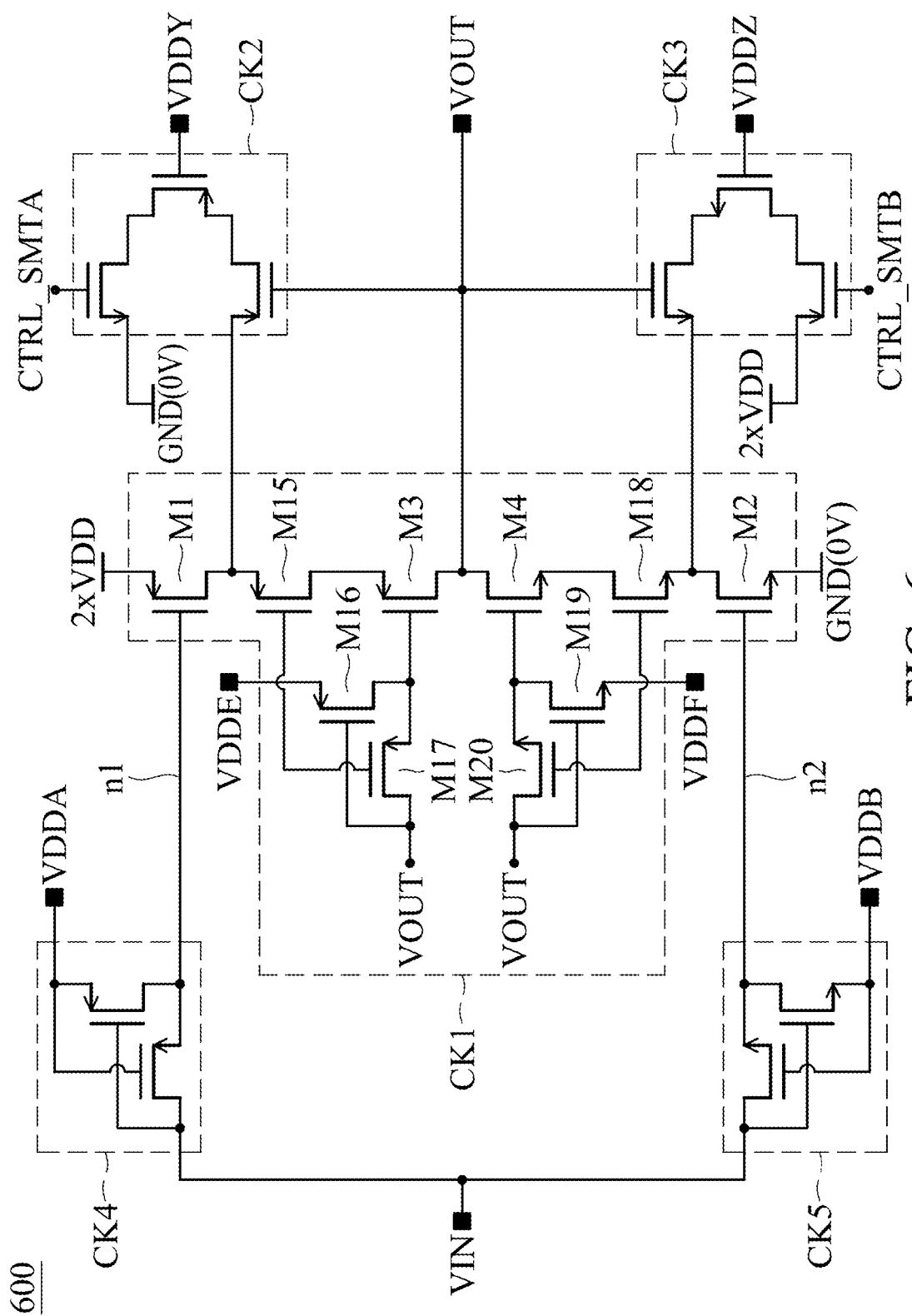
FIG. 6 depicts a hysteresis circuit 600 in details in accordance with another exemplary embodiment of the present invention.

FIG. 6 depicts a hysteresis circuit 600 in details in accordance with another exemplary embodiment of the present invention. In comparison with FIG. 5, the inverter CK1 of FIG. 6 has PMOS transistors M15~M17, and NMOS transistors M18~M20.

The PMOS transistor M15 is coupled between the PMOS transistors M1 and M3. The bias voltage VDDE (<VDD, and ≥VDDA) is coupled to the gate terminal of the PMOS transistor M3 through the PMOS transistor M16. The gate terminal of the PMOS transistor M16 is coupled to the output VOUT. The gate terminal of the transistor M3 is further coupled to the output VOUT through the PMOS transistor M17. The gate terminal of the PMOS transistor M17 is coupled to the gate terminal of the PMOS transistor M15.

The NMOS transistor M18 is coupled between NMOS transistors M2 and M4. The bias voltage VDDF (>VDD, and ≤VDDB) is coupled to the gate terminal of the NMOS transistor M4 through the NMOS transistor M19. The gate terminal of the NMOS transistor M19 is coupled to the output VOUT. The gate terminal of the NMOS transistor M4 is further coupled to the output VOUT through the NMOS transistor M20. The gate terminal of the NMOS transistor M20 is coupled to the gate terminal of the NMOS transistor M18.

Figure 7:
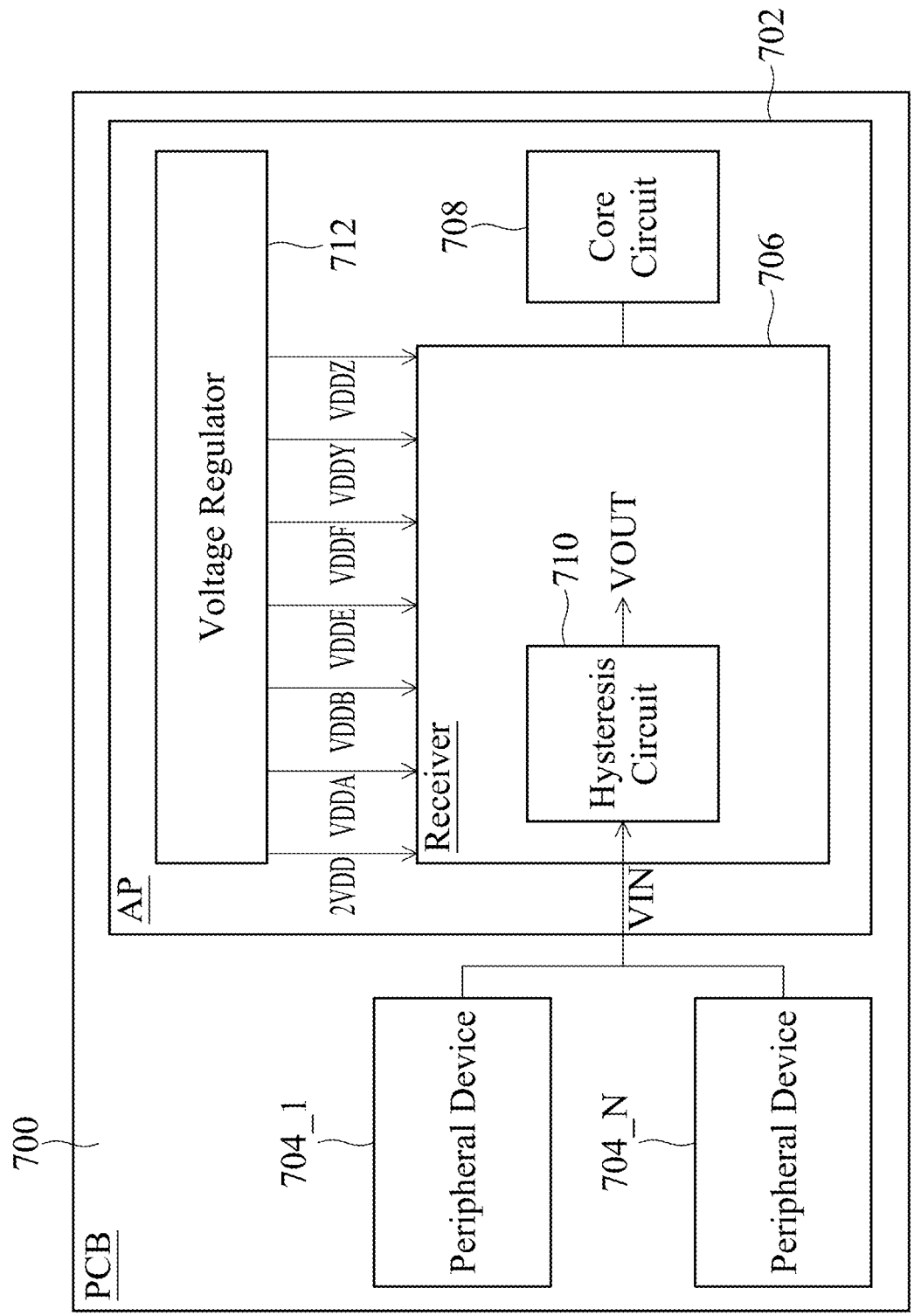
FIG. 7 depicts a printed circuit board (PCB) 700 in accordance with an exemplary embodiment of the present invention.

FIG. 7 depicts a printed circuit board (PCB) 700 in accordance with an exemplary embodiment of the present invention. An application processor (AP) 702 and a plurality of peripheral devices 704_1 to 704_N are mounted on the PCB 700. The AP 702 has a receiver 706 receiving signals transferred from the peripheral devices 704_1 to 704_N, and a core circuit 708 coupled to the receiver 706. The receiver 706 has the disclosed hysteresis circuit 710 that transforms the input VIN into the output VOUT. The AP 702 may further includes a voltage regulator 712 for providing the hysteresis circuit 710 with the overdrive voltage 2VDD and the bias voltages VDDA, VDDB, VDDE, VDDF, VDDY and VDDZ. The hysteresis circuit 710 provides strong signal integrity.

In another exemplary embodiment, the hysteresis circuit of the present invention is used in a receiver of a peripheral device.

In the present invention, a hysteresis circuit with an overdrive design (powered by 2VDD) is shown, and the hysteresis circuit is biased by at least two special bias voltages VDDA (<VDD) and VDDB (>VDD)). Any chip having a receiver including the aforementioned Schmitt trigger circuit should be considered within the scope of the present invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip, comprising:
   a core circuit; and
   a receiver, coupled to the core circuit,
   wherein:
   the receiver includes a hysteresis circuit that processes a signal received from a device external to the chip, the hysteresis circuit is powered by an overdrive voltage which is twice a power supply voltage, and the hysteresis circuit has a protection circuit, an inverter, and a latch;
   an input of the hysteresis circuit is coupled to the inverter through the protection circuit, to be transformed into an output, and the latch is coupled to the inverter for positive feedback control;
   the protection circuit has a first sub-circuit biased by a first bias voltage that is lower than the power supply voltage, and a second sub-circuit biased by a second bias voltage that is greater than the power supply voltage;
   through the first sub-circuit of the protection circuit, the input is coupled to the inverter to control a pull-up path of the inverter;
   through the second sub-circuit of the protection circuit, the input is coupled to the inverter to control a pull-down path of the inverter;
   the pull-up path of the inverter is biased by a third bias voltage that is less than the power supply voltage;
   the pull-down path of the inverter is biased by a fourth bias voltage that is greater than the power supply voltage;
   the latch has a first sub-circuit biased by a fifth bias voltage that is less than the power supply voltage, and a second sub-circuit biased by a sixth bias voltage that is greater than the power supply voltage;
   the first sub-circuit of the latch is coupled to the pull-up path of the inverter; and
   the second sub-circuit of the latch is coupled to the pull-down path of the inverter.

2. The chip as claimed in claim 1, wherein:
   the third bias voltage is greater than or equal to the first bias voltage; and
   the fourth bias voltage is less than or equal to the second bias voltage.

3. The chip as claimed in claim 2, wherein:
   the fifth bias voltage is greater than or equal to the first bias voltage; and
   the sixth bias voltage is less than or equal to the second bias voltage.

4. The chip as claimed in claim 3, wherein the inverter comprises:
   a first transistor, having a source terminal coupled to the overdrive voltage, and a gate terminal coupled to an output terminal of the first sub-circuit of the protection circuit;

a second transistor, having a source terminal coupled to a power ground voltage, and a gate terminal coupled to an output terminal of the second sub-circuit of the protection circuit;

a third transistor, coupling the first transistor to an output terminal of the hysteresis circuit, and having a gate terminal coupled to the third bias voltage; and a fourth transistor, coupling the second transistor to the output terminal of the hysteresis circuit, and having a gate terminal coupled to the fourth bias voltage.

5. The chip as claimed in claim 4, wherein the first sub-circuit of the latch circuit comprises:

a fifth transistor, having a source terminal coupled to the drain terminal of the first transistor, and a gate terminal coupled to the output terminal of the hysteresis circuit; and a sixth transistor, coupling a drain terminal of the fifth transistor to the power ground voltage, and having a gate terminal coupled to the fifth bias voltage.

6. The chip as claimed in claim 5, wherein the first sub-circuit of the latch circuit further comprises:

a seventh transistor, coupling a drain terminal of the sixth transistor to the power ground voltage, and having a gate terminal controlled by a first control signal, wherein the first sub-circuit of the latch circuit is enabled according to the first control signal.

7. The chip as claimed in claim 6, wherein:

the first, third, fifth, and sixth transistors are p-channel metal-oxide-silicon transistors; and the seventh transistor is an n-channel metal-oxide-silicon transistor.

8. The chip as claimed in claim 4, wherein the second sub-circuit of the latch circuit comprises:

an eighth transistor, having a source terminal coupled to the drain terminal of the second transistor, and a gate terminal coupled to the output terminal of the hysteresis circuit; and a ninth transistor, coupling a drain terminal of the eighth transistor to the overdrive voltage, and having a gate terminal coupled to the sixth bias voltage.

9. The chip as claimed in claim 8, wherein the second sub-circuit of the latch circuit further comprises:

a tenth transistor, coupling a drain terminal of the ninth transistor to the overdrive voltage, and having a gate terminal controlled by a second control signal, wherein the second sub-circuit of the latch circuit is enabled according to the second control signal.

10. The chip as claimed in claim 9, wherein:

the second, fourth, eighth, and ninth transistors are n-channel metal-oxide-silicon transistors; and the tenth transistor is a p-channel metal-oxide-silicon transistor.

11. The chip as claimed in claim 4, wherein the first sub-circuit of the protection circuit comprises:

an eleventh transistor, coupled between an input terminal of the hysteresis circuit and the gate terminal of the first transistor; and a twelfth transistor, coupling the gate terminal of the first transistor to the first bias voltage, and having a gate terminal coupled to the input terminal of the hysteresis circuit.

12. The chip as claimed in claim 11, wherein:

the first, third, eleventh, and twelfth transistors are p-channel metal-oxide-silicon transistors.

13. The chip as claimed in claim 4, wherein the second sub-circuit of the protection circuit comprises:

a thirteenth transistor, coupled between an input terminal of the hysteresis circuit and the gate terminal of the second transistor; and a fourteenth transistor, coupling the gate terminal of the second transistor to the second bias voltage, and having a gate terminal coupled to the input terminal of the hysteresis circuit.

14. The chip as claimed in claim 13, wherein:

the second, fourth, thirteenth, and fourteenth transistors are n-channel metal-oxide-silicon transistors.

15. The chip as claimed in claim 4, wherein the inverter further comprises:

a fifteenth transistor, coupling the first transistor to the third transistor;

a sixteenth transistor, coupling the gate terminal of the third transistor to the third bias voltage, and having a gate terminal coupled to the output terminal of the hysteresis circuit;

a seventeenth transistor, coupled between the output terminal of the hysteresis circuit and the gate terminal of the third transistor, and having a gate terminal coupled to a gate terminal of the fifteenth transistor;

an eighteenth transistor, coupling the second transistor to the fourth transistor;

a nineteenth transistor, coupling the gate terminal of the fourth transistor to the fourth bias voltage, and having a gate terminal coupled to the output terminal of the hysteresis circuit; and a twentieth transistor, coupled between the output terminal of the hysteresis circuit and the gate terminal of the fourth transistor, and having a gate terminal coupled to a gate terminal of the eighteenth transistor.

16. The chip as claimed in claim 15, wherein:

the first, third, fifteenth, sixteenth, and seventeenth transistors are p-channel metal-oxide-silicon transistors; and the second, fourth, eighteenth, nineteenth, and twentieth transistors are n-channel metal-oxide-silicon transistors.

* * * * *